United States Patent
Anthony et al.

(10) Patent No.: US 6,870,758 B2
(45) Date of Patent: Mar. 22, 2005

(54) MAGNETIC MEMORY DEVICE AND METHODS FOR MAKING SAME

(75) Inventors: Thomas C. Anthony, Sunnyvale, CA (US); Darrel R. Bloomquist, deceased, late of Meridian, ID (US); by Judy Bloomquist, legal representative, Meridian, ID (US); Manoj K. Bhattacharyya, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 20 days.

(21) Appl. No.: 10/283,559

(22) Filed: Oct. 30, 2002

(65) Prior Publication Data

US 2004/0085808 A1 May 6, 2004

(51) Int. Cl.[7] ............................................. G11C 11/00
(52) U.S. Cl. .................... 365/158; 365/173; 365/171
(58) Field of Search .................................. 365/158, 173, 365/171

(56) References Cited

U.S. PATENT DOCUMENTS

| 5,465,185 | A | 11/1995 | Heim et al. |
| 5,650,958 | A | 7/1997 | Gallagher et al. |
| 6,191,972 | B1 * | 2/2001 | Miura et al. ................. 365/171 |
| 6,205,053 | B1 | 3/2001 | Anthony |
| 6,538,921 | B2 * | 3/2003 | Daughton et al. .......... 365/171 |
| 6,654,278 | B1 * | 11/2003 | Engel et al. ................. 365/158 |

* cited by examiner

*Primary Examiner*—Richard Elms
*Assistant Examiner*—Tuan T. Nguyen (57) ABSTRACT

In one embodiment, a memory device includes a plurality of magnetic data cells and a magnetic reference cell extending uninterrupted along more than one of the plurality of data cells.

28 Claims, 5 Drawing Sheets

MAGNETIC MEMORY DEVICE AND METHODS FOR MAKING SAME

THE FIELD OF THE INVENTION

The present invention generally relates to nonvolatile memory devices, and more particularly to memory devices that use magnetic memory cells.

BACKGROUND OF THE INVENTION

One type of nonvolatile memory known in the art relies on magnetic memory cells. Known as magnetic random access memory (MRAM) devices, these devices include an array of magnetic memory cells. The magnetic memory cells may be of different types. For example, a magnetic tunnel junction (MTJ) memory cell or a giant magnetoresistive (GMR) memory cell.

The typical magnetic memory cell includes a layer of magnetic film in which the magnetization is alterable and a layer of magnetic film in which the magnetization is fixed or "pinned" in a particular direction. The magnetic film having alterable magnetization may be referred to as a sense layer or data storage layer and the magnetic film that is fixed may be referred to as a reference layer or pinned layer.

Conductive traces (commonly referred to as word lines and bit lines, or collectively as write lines) are routed across the array of memory cells. Word lines extend along rows of the memory cells, and bit lines extend along columns of the memory cells. Located at each intersection of a word line and a bit line, each memory cell stores the bit of information as an orientation of a magnetization. Typically, the orientation of magnetization in the data storage layer aligns along an axis of the data storage layer that is commonly referred to as its easy axis. External magnetic fields are applied to flip the orientation of magnetization in the data storage layer along its easy axis to either a matching (i.e., parallel) or opposing (i.e, anti-parallel) orientation with respect to the orientation of magnetization in the reference layer, depending on the desired logic state.

The orientation of magnetization of each memory cell will assume one of two stable orientations at any given time. These two stable orientations, parallel and anti-parallel, represent logical values of "1" and "0". The orientation of magnetization of a selected memory cell may be changed by supplying current to a word line and a bit line crossing the selected memory cell. The currents create magnetic fields that, when combined, can switch the orientation of magnetization of the selected memory cell from parallel to anti-parallel or vice versa.

Figure 1A:
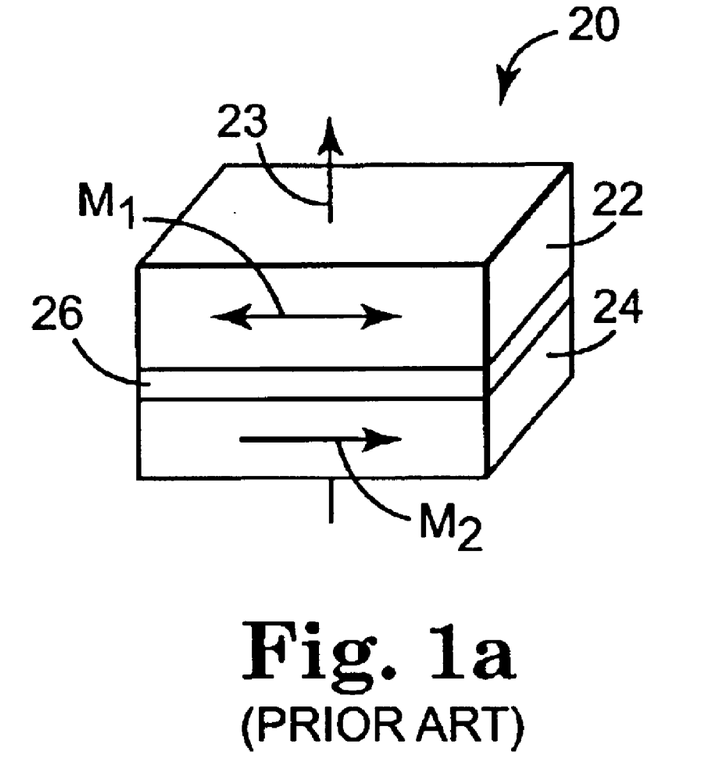
FIGS. 1a through 1c are profile and side illustrations of a simplified magnetic memory cell illustrating an orientation of magnetization of active and reference magnetic films.
Figure 1B:
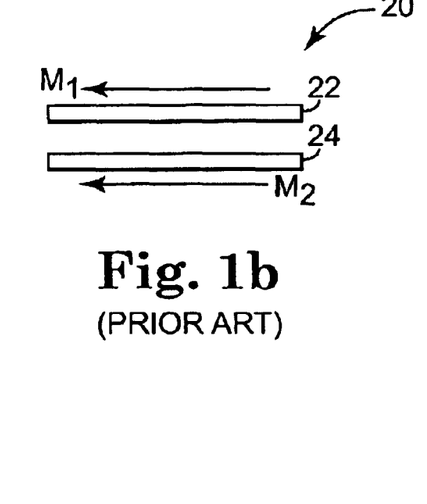
Figure 1C:
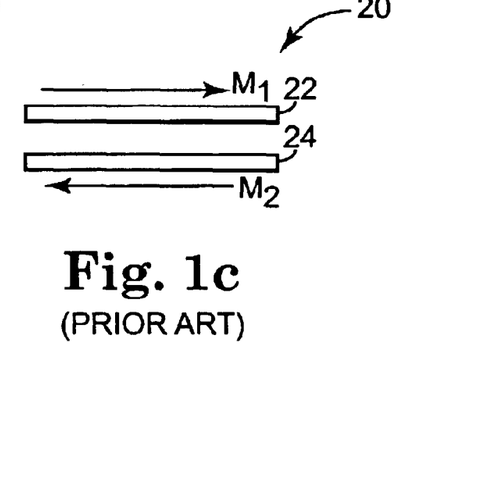

FIGS. 1a through 1c illustrate the storage of a bit of data in a single memory cell 20. In FIG. 1a, the memory cell 20 includes an active magnetic data film 22 and a pinned magnetic film 24 which are separated by a dielectric region 26. The orientation of magnetization in the active magnetic data film 22 is not fixed and can assume two stable orientations as shown by arrow $M_1$. On the other hand, the pinned magnetic film 24 has a fixed orientation of magnetization shown by arrow $M_2$. The active magnetic data film 22 rotates its orientation of magnetization in response to electrical currents applied to the write lines (130,132, not shown) during a write operation to the memory cell 20. The first logic state of the data bit stored in memory cell 20 is indicated when $M_1$ and $M_2$ have matching (i.e, parallel) orientations as illustrated in FIG. 1b. For instance, when $M_1$ and $M_2$ have matching orientations, a logic "1" state is stored in the memory cell 20. Conversely, a second logic state is indicated when $M_1$ and $M_2$ have opposite (i.e, anti-parallel) orientations as illustrated in FIG. 1c. When the orientations of $M_1$ and $M_2$ are opposite each other, a logic "0" state is stored in the memory cell 20. In FIGS. 1b and 1c the dielectric region 26 has been omitted. Although FIGS. 1a through 1c illustrate the active magnetic data film 22 positioned above the pinned magnetic film 24, their positions may be reversed.

The logic state of the data bit stored in the memory cell 20 can be determined by measuring its resistance. The resistance of the memory cell 20 is reflected by a magnitude of a sense current 23 (referring to FIG. 1a) that flows in response to read voltages applied to the write lines 30, 32.

Figure 2:
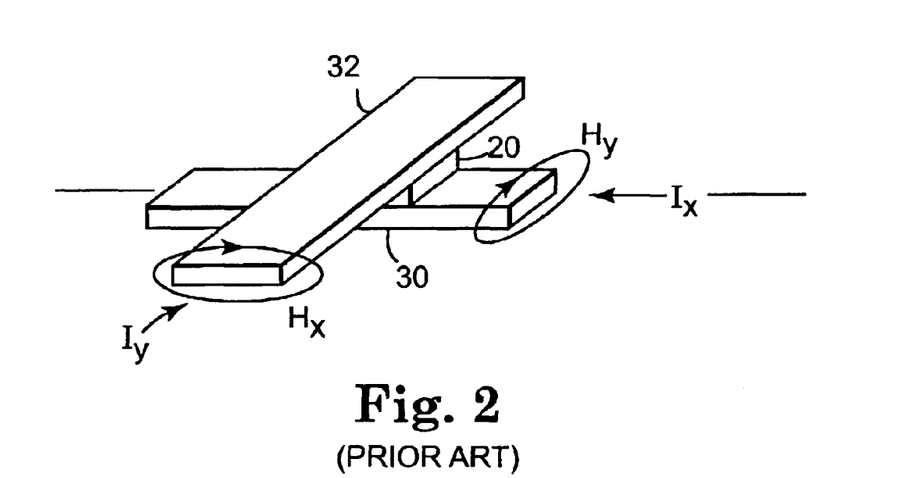
FIG. 2 is a profile block diagram of a prior art magnetic memory cell, its write lines, and magnetic fields generated by currents flowing through the write lines.

In FIG. 2, the memory cell 20 is positioned between the write lines 30, 32. The active and pinned magnetic films 22,24 are not shown in FIG. 2. The orientation of magnetization of the active magnetic data film 22 is rotated in response to a current $I_x$ that generates a magnetic field $H_y$ and a current $I_y$ that generates a magnetic field $H_x$. The magnetic fields $H_x$ and $H_y$ act in combination to rotate the orientation of magnetization of the memory cell 20.

As illustrated in the above Figures, the layers of magnetic material are typically formed as geometrically patterned films such as squares, ellipses, or rectangles. One disadvantage of patterned magnetic layer storage structures is that patterned magnetic layers generate a magnetostatic field that tends to demagnetize the layer. This demagnetizating field tends to reorient the magnetization of the thin film so as to minimize the energy of the patterned element, the end result being a non-uniform or multi-domain magnetization state. Magnetostatic fields from patterned layers also interact with magnetic material in proximity to the edges of the patterned film, potentially disrupting the magnetization state in the proximate magnetic material. For example, referring to FIG. 1a, the magnetization $M_2$ of pinned magnetic film 24 creates a demagnetization field in a direction opposing $M_2$. This field interacts with data film 22 and biases the magnetic hysteresis loop of the data film such that the hysteresis loop may no longer be symmetric about zero field. In a memory application this offset can be very damaging. If the offset is greater than the coercivity of the data film, then there is loss of data after removal of the writing field. An offset field lower than the coercivity is also detrimental in that it introduces asymmetry into the writing process. Any variation in this offset field adversely affects the writing margin when attempting to write a single data film within an array of memory elements.

When reading the magnetic memory elements, non-uniform magnetization or multiple domains tend to create noise or areas of varying resistance across the memory cell that makes determination of the state of the memory cell difficult or impossible. In addition, variation in the domain states can produce fluctuations in the switching field that can render the memory cell writing process unpredictable. From the above, it can be seen that maintaining a uniform magnetization direction in the magnetic layers is important. In the case of the fixed magnetization of the reference layer, it is thus desirable to pin the magnetization in a manner that minimizes the presence of magnetostatic fields that may interact in a deleterious manner with the data film.

SUMMARY OF THE INVENTION

One embodiment of a memory device comprises a plurality of magnetic data cells and a magnetic reference cell extending uninterrupted along more than one of the plurality of data cells.

One method for creating a memory device comprises depositing a reference layer, depositing a separation layer over the reference layer, and depositing a sense layer over the separation layer. The sense layer is patterned to form a plurality of data cells, and the separation layer and reference layer are patterned to form a plurality of elongated reference cells. Each of the plurality of elongated reference cells extends past more than one of the plurality of data cells.

DETAILED DESCRIPTION

In the following detailed description, reference is made to the accompanying drawings which form a part hereof, and in which like numerals are used for like and corresponding parts of the drawings.

The several embodiments of magnetic memory devices described herein include a reference cell which has a known stable magnetic orientation in a magnetic random access memory (MRAM) stack. The orientation of magnetization of the reference cell is maintained by introducing magnetic anisotropy into the reference cell. Magnetic anisotropy refers generally to the exhibition of preferred directions of magnetization in a magnetic material. The introduction of magnetic anisotropy ensures that the magnetization of the reference layer remains pinned in the desired orientation when subjected to magnetic fields normally encountered in an MRAM device. In addition, magnetic anisotropy significantly reduces the tendency for the magnetization of the reference cell to break up into multiple domains. For example, variations in the reference cell composition or shape contribute to the magnetic anisotropy observed. Alternatively, unidirectional anisotropy can be introduced to the reference cell by coupling a ferromagnetic layer to an antiferromagnetic layer.

Embodiments of the invention minimize or eliminate demagnetization fields associated with the reference layer in the vicinity of the data cells. As will be shown in the subsequent detailed descriptions, this is accomplished in one embodiment by employing an elongated reference cell that reduces or eliminates the effects of demagnetization fields associated with the peripheral edges of the reference cell.

Figure 3A:
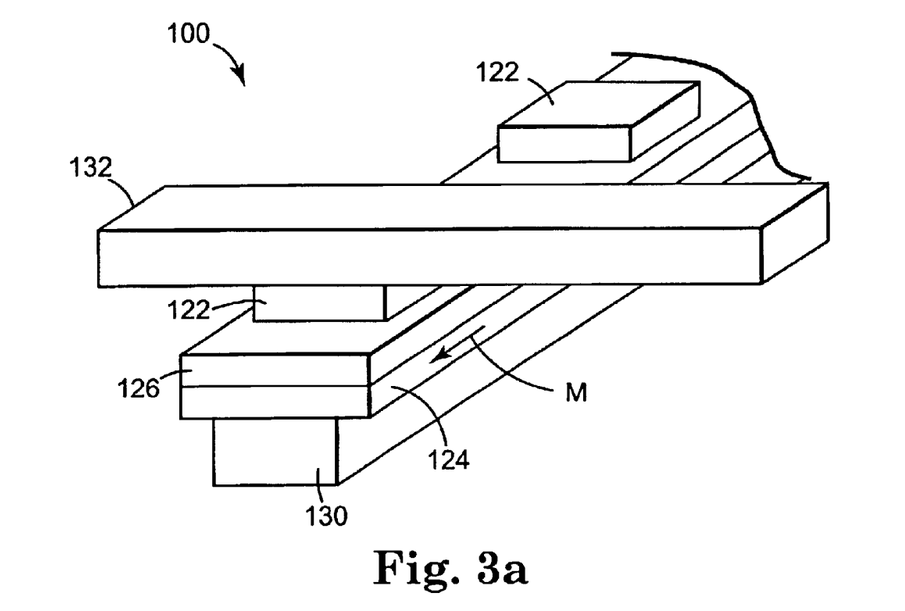
FIG. 3A is a perspective illustration of a memory device according to one embodiment of the invention.

One embodiment of a magnetic memory device 100 according to the invention is shown in FIG. 3A. Memory device 100 includes reference cells 124 which extend uninterrupted along a plurality of data cells 122, with a separation or barrier layer 126 positioned between the reference cells 124 and the data cells 122. The reference cells 124 may lie substantially along a write conductor 130. A second write conductor 132 lies substantially perpendicular to write conductor 130. Write conductors 130,132 are shown in FIG. 3A to be positioned such that they are in contact with data cells 122 and reference cells 124. However, in alternate embodiments write conductors may be spaced by some distance from data cells 122 and reference cells 124. Additional conductors (not shown) may optionally be provided to separate the "read" and "write" functions of the conductors.

The magnetic orientation of the reference cell 124 is pinned by shape anisotropy. Shape anisotropy is created by increasing one dimension (e.g., length) of a ferromagnetic layer with respect to another dimension (e.g., width) of the layer. The introduction of shape anisotropy helps to ensure predictability with respect to the orientation of the magnetic vectors within the reference cell.

Shape anisotropy describes the influence of geometry on the directional dependence of the ability to magnetize an otherwise magnetically isotropic sample in an applied magnetic field. Generally, magnetization of a film along its shortest dimension (i.e., across its width) is more difficult because the demagnetizing field is greatest in that direction. For a rectangular magnetic element of thickness T and width W (where length>>W), the shape anisotropy $H_{shape}$ of the element is approximated as:

$$H_{shape}=4\pi M_s T/W$$

where $M_s$ is the saturation magnetization of the element.

Magnetization is constrained to be aligned with the long dimension of the element by shape anisotropy, which can be on the order of at least several hundred Oersteds for materials typically envisioned for use in magnetic memory cells. For example, for a NiFeCo film ($4\pi M_s$ equals approximately 12000 Gauss) the shape anisotropy $H_{shape}$ is about 600 Oersteds for a 10 nm thick film having a 0.2 $\mu$m width. The shape anisotropy of an Fe film ($4\pi M_s$ equals approximately 21000 Gauss) would be even greater. This shape anisotropy is significant enough to force the magnetization to always lie along the length of the patterned reference layer.

In the reference cells 124, the orientation of magnetization M lies along the length of the reference cell 124. In the data cells 122, the easy axis of the cells lies parallel to the orientation of magnetization M in the reference cells 124. The length-to-width ratio of each reference cell 124 is substantially larger than the length-to-width ratio of the data cells 122. In one embodiment according to the invention, the reference cells 124 have a length-to-width ratio of at least 4:1, the width of the elongated reference cells 124 is in the range of approximately 0.05–5.0 $\mu$m, and the data cells 122 have dimensions in the range of approximately 0.05–1.0 $\mu$m. The separation layer 126 may be either a conductive material or a non-conductive material, depending upon the type of memory cell to be constructed.

In another embodiment according to the invention, the magnetic orientation of the reference cells 124 is defined to lie along the long dimension of the elongated reference cell 124 (refer to FIG. 3A) by magnetocrystalline anisotropy alone, or by a combination of shape and magnetocrystalline anisotropies. Magnetocrystalline anisotropy refers to the influence of material composition and crystallographic orientation on the directional dependence of the ability to magnetize a sample in a magnetic field. The films commonly selected for use in magnetic nonvolatile memory applications exhibit uniaxial magnetocrystalline anisotropy. The material is easier to magnetize along a particular axis. This axis is typically referred to as the "easy axis" of the film. While the magnetocrystalline anisotropy of NiFe is only about 5 Oe, "hard" magnetic alloys, for example CoPt, can have magnetocrystalline anisotropies of hundreds, or even thousands, of Oersteds. The orientation of the easy axis can be defined by deposition in a magnetic field, by post-deposition annealing in a magnetic field, or by control of the crystallographic orientation.

In yet another embodiment the magnetic orientation of reference cells 124 is defined to lie along the long dimension of the elongated reference cell 124 (refer to FIG. 3B) by exchange coupling the ferromagnetic reference layer to an antiferromagnetic layer 128. Exchange coupling the reference cell 124 to an antiferromagnetic layer 128 introduces a uniaxial anisotropy into the elongated reference cell 124, giving the magnetization of the reference layer a unique preferred orientation. The anisotropy direction can be specified by deposition in a magnetic field or by post-deposition magnetic field annealing. Examples of antiferromagnetic materials for this application are IrMn, FeMn, PtMn, CrPtMn NiMn, NiO and Fe2O3. Uniaxial anisotropies of several hundred Oersteds can be introduced in this manner.

Figure 3B:
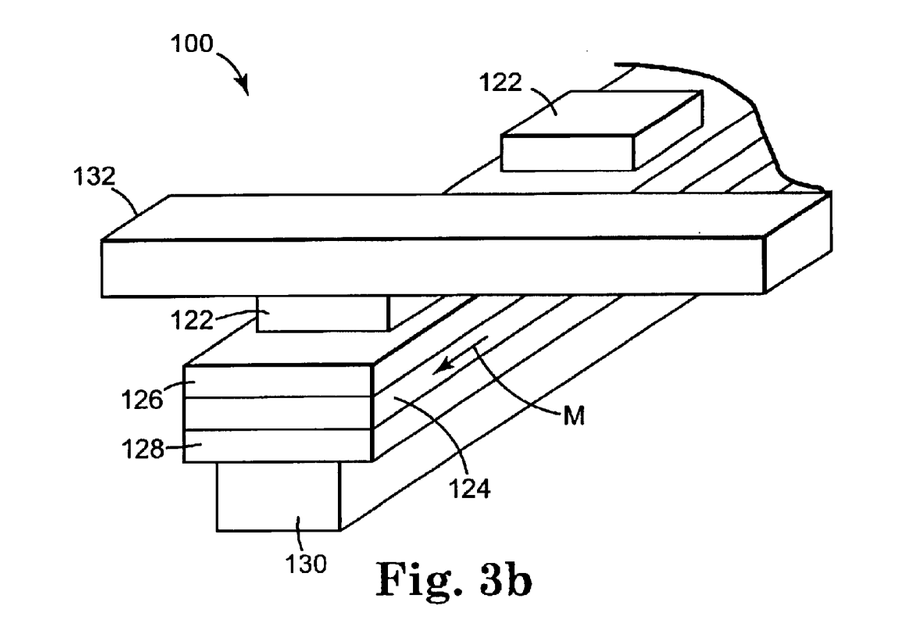
FIG. 3B is a perspective illustration of a memory device according to another embodiment of the invention.
Figure 4:
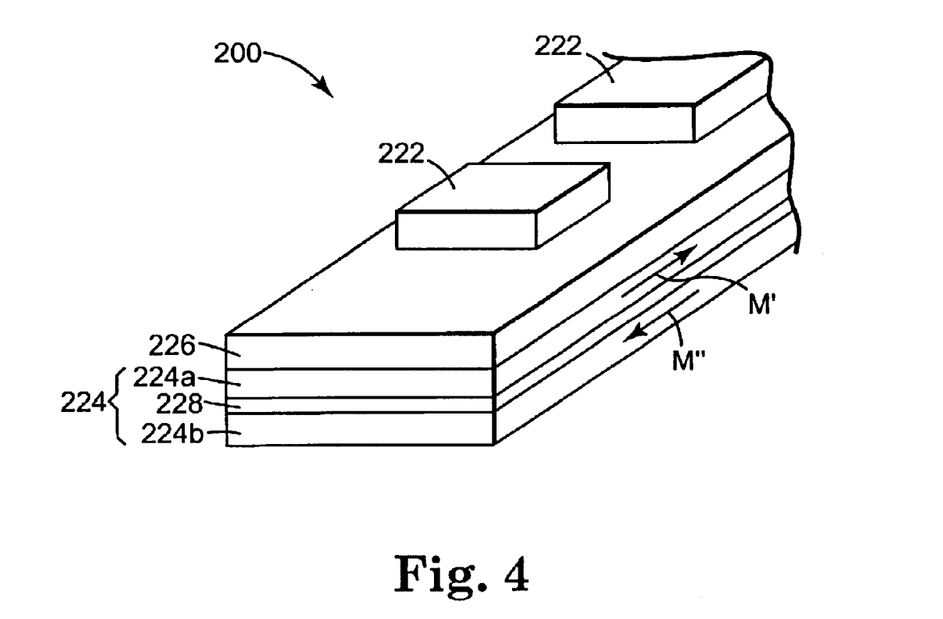
FIG. 4 is a perspective illustration of a memory device according to another embodiment of the invention.

The elongated reference layer in FIGS. 3A and 3B need not be comprised of only a single ferromagnetic film. Another embodiment of a magnetic memory device 200 according to the invention is shown in FIG. 4. Write conductors 130, 132 are not shown for purpose of clarity, but would be situated similarly to those shown in FIG. 3. In the embodiment of FIG. 4, memory device 200 uses two or more ferromagnetic layers to form a reference cell 224, with each pair of adjacent ferromagnetic layers separated by a non-magnetic layer. In FIG. 4, reference cell 224 is shown to include two ferromagnetic layers 224a, 224b separated by a non-magnetic spacer layer 228. In alternate embodiments according to the invention, additional ferromagnetic and spacer layers may be provided.

Similar to the earlier-described embodiments, the reference cell 224 is patterned in an elongated manner, and the easy axes of the ferromagnetic layers are oriented along the long dimension. Definition of the easy axis direction can be done by deposition in an applied magnetic field or by post-deposition magnetic field annealing, for example.

The non-magnetic spacer 228 is preferably chosen from a group of materials that are known to mediate exchange coupling between two ferromagnetic layers. Examples of suitable materials include Cu, Cr, Ru, Re, and Os. The exchange coupling is known to oscillate between ferromagnetic and antiferromagnetic as a function of the thickness of spacer 228. A preferred spacer thickness produces antiferromagnetic coupling between the ferromagnetic layers 224a, 224b. The preferred thickness is dependent on the particular spacer material, but is generally less than approximately 5 nm, and can be as little as 0.4 nm. The thickness of each of the ferromagnetic layers is typically less than 10 nm. Examples of suitable ferromagnetic materials are NiFe, Co, Fe, CoFe, NiFeCo, CrO2 and Fe3O4.

In the embodiment of FIG. 4, each elongated reference cell 224 extends uninterrupted along a plurality of data cells 222, with separation or barrier layer 226 positioned between reference cell 224 and data cells 222. The two ferromagnetic layers 224a, 224b of the reference cell 224 are coupled such that the orientations of magnetization M' and M" of the reference cells 224a and 224b are parallel to the long dimension of the reference cell 224. Because the orientations of magnetization M', M" may be ambiguous, in one embodiment according to the invention one of ferromagnetic layers 224a, 224b is thicker than the other to positively determine the orientations of magnetization M' and M" along the reference cell 224.

Figure 5:
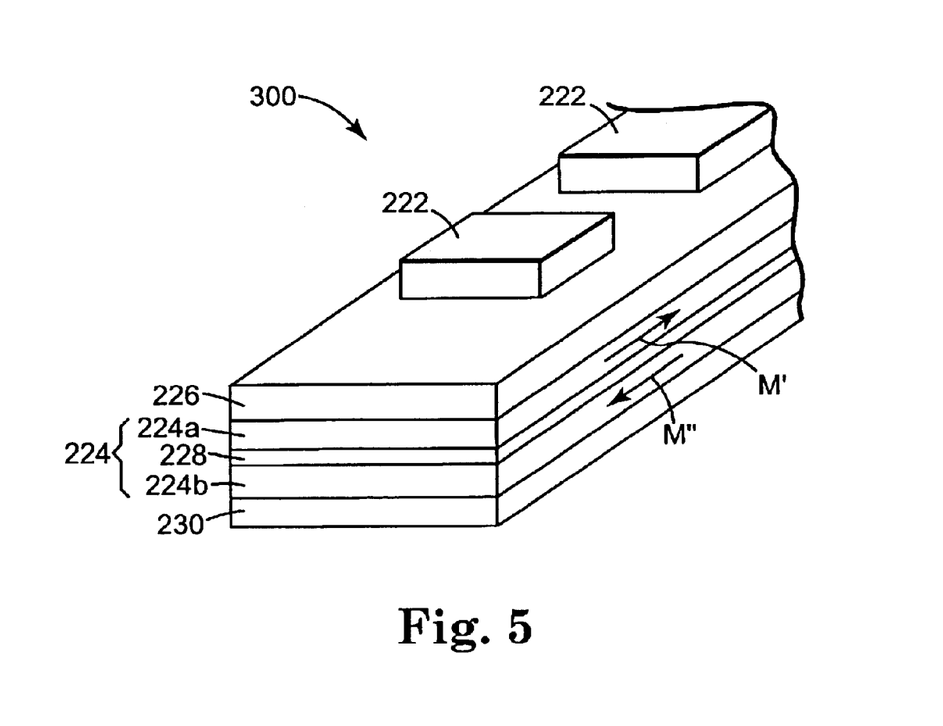
FIG. 5 is a perspective illustration of a memory device according to another embodiment of the invention.

Yet another embodiment of a magnetic memory device 300 according to the invention is shown in FIG. 5. As in FIG. 4, write conductors 130, 132 are not shown for purpose of clarity, but would be situated similarly to those shown in FIGS. 3A and 3B. Memory device 300 is constructed substantially the same as memory device 200 shown in FIG. 4, and like components are similarly numbered.

The embodiment according to the invention shown in FIG. 5 positively determines the directions of magnetizations M' and M" across reference cell 224 by adding an antiferromagnetic layer 230 immediately adjacent reference cell 224. Specifically, ambiguity in the preferred magnetization orientations M' and M" of the reference layer 224 is removed by coupling the outermost ferromagnetic layer 224b in the multilayer reference stack to antiferromagnetic layer 230. Coupling ferromagnetic layer 224b to antiferromagnetic layer 230 defines the magnetization orientation M" of ferromagnetic film layer 224b. Since in the preferred case adjacent ferromagnetic layers are oriented opposing one another (i.e, anti-parallel), the magnetization orientation M' of ferromagnetic layer 224a in the multilayer stack is also defined.

In the foregoing embodiments the easy axes of the data cells are along the long dimension of the elongated reference cell, and the magnetization of the elongated reference cell is constrained to lie along its long dimension. This configuration eliminates demagnetization fields from the reference layer, since there are no gradients in magnetization present within the elongated reference layer. Hence, the data cells have no magnetostatic fields from the reference layer.

Figure 6:
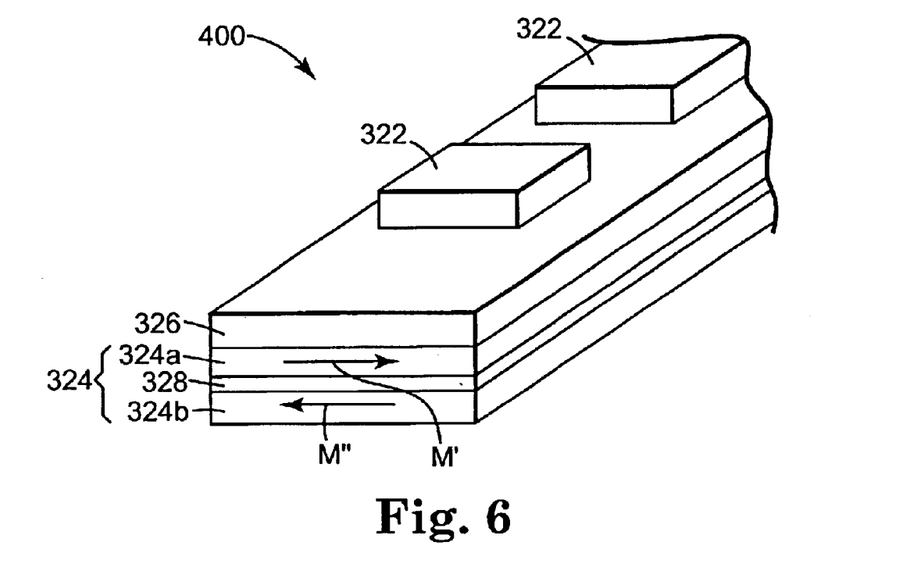
FIG. 6 is a perspective illustration of a memory device according to another embodiment of the invention.

An alternative embodiment of a memory device 400 that contains multiple ferromagnetic layers as the reference cell is presented in FIG. 6. Similar to the earlier described embodiments, the reference cell 324 is patterned in an elongated manner. However, in contradistinction to the earlier described embodiments, the preferred magnetization orientation of the ferromagnetic layers 324a, 324b which form reference cell 324 in this case is perpendicular to the long dimension of the elongated reference cell 324 (i.e., across the width of the reference cell 324, rather than along the length of reference cell 324).

A magnetization orientation perpendicular to the long dimension of the elongated reference cell can be realized by having the easy axis of the ferromagnetic layers in this direction. Definition of the easy axis direction can be done by deposition in an applied magnetic field or by post-deposition magnetic field annealing, for example. After patterning the elongated reference cell, magnetostatic interactions between the pairs of ferromagnetic layers will tend to further stabilize antiferromagnetic alignment between ferromagnetic pairs. Similar to the embodiment of FIG. 4, the non-magnetic spacer layer is selected from a materials set known to enhance the antiferromagnetic orientation.

Reference layers 324a, 324b of the memory device 400 shown in FIG. 6 rely on magnetocrystalline anisotropy to maintain the orientation of magnetization in the reference cell 324. In the embodiment of FIG. 6, each elongated reference cell 324 extends uninterrupted along a plurality of data cells 322, with separation or barrier layer 326 positioned between reference cell 324 and data cells 322. The two ferromagnetic layers 324a, 324b of the reference cell 324 are separated by non-magnetic spacer layer 328 and coupled such that the orientations of magnetization M' and M" of the reference cells 324a and 324b are perpendicular to the long dimension of the reference cell 324. Because the orientations of magnetization M', M" may be ambiguous, in one embodiment, according to the invention, one of ferromagnetic layers 324a, 324b is thicker than the other to positively determine the direction of the orientations of magnetization M' and M" across the reference cell 324. In the data cells 322, the easy axis of the cells 322 lies parallel to the orientation of magnetization M' in the reference cell 324.

Figure 7:
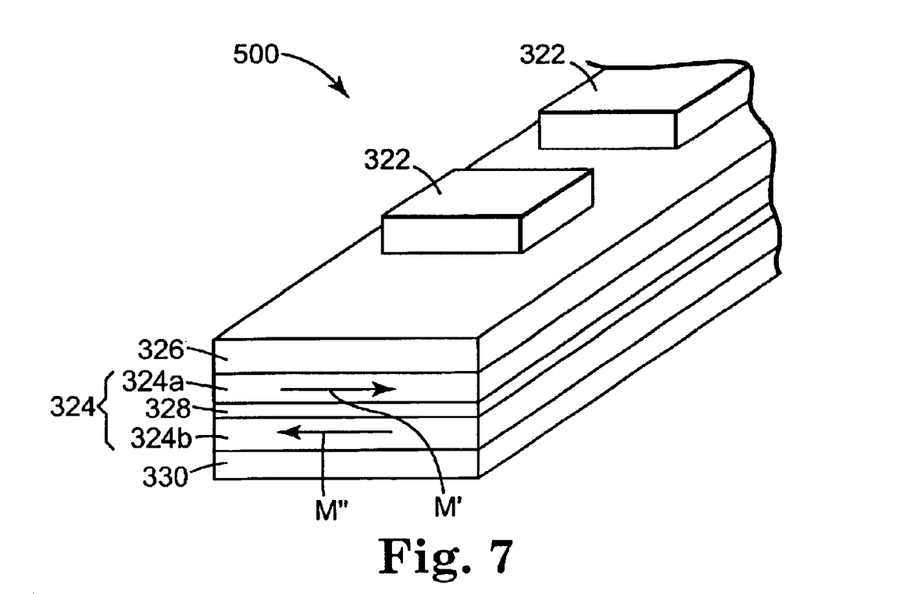
FIG. 7 is a perspective illustration of a memory device according to another embodiment of the invention.

As the width of the reference cell 324 decreases, the opposing magnetization orientations of ferromagnetic layers 324a, 324b is further stabilized by strong magnetostatic coupling between the layers. In one embodiment according to the invention, the reference cell 324 has a width of less than approximately 5 μm, and is preferably less than approximately 0.3 μm in width A final embodiment of a magnetic memory device 500 according to the invention is shown in FIG. 7. As in FIG. 6, write conductors 130, 132 are not shown for purpose of clarity, but would be situated similarly to those shown in FIG. 3. Memory device 500 is constructed substantially the same as memory device 400 shown in FIG. 6, and like components are similarly numbered.

The embodiment according to the invention shown in FIG. 7 positively determines the direction of orientation of magnetizations M' and M" across reference cell 324 by adding an antiferromagnetic layer 330 immediately adjacent reference cell 324. Specifically, ambiguity in the preferred magnetization orientations M' and M" of the reference layer 324 is removed by coupling the outermost ferromagnetic layer 324b in the multilayer reference stack to antiferromagnetic layer 330. Coupling ferromagnetic layer 324b to antiferromagnetic layer 330 defines the magnetization orientation M" of ferromagnetic film layer 324b. Since adjacent ferromagnetic layers are always oriented with their magnetic orientations opposing one another, the magnetization orientation M' of ferromagnetic layer 324a in the multilayer stack is also defined.

The memory devices 100, 200, 300, 400, 500 described herein may generally be created using semiconductor processing techniques known in the art. In one method for creating the memory devices, a grating of conductors (the write conductors) is formed using any suitable technique known in the art. A stack of material for creating the memory cell (reference cell 124, 224, 324, separation or barrier layer 126, 226, 326 and data cell 122, 222, 322) is deposited in an unpatterned condition over the conductors. Next, the upper layer is patterned to form a plurality of individual data cells 122, 222, 322. The separation layer 126, 226, 326 and reference cells 124, 224, 324 are then patterned to form a plurality of elongated reference cells 124, 224, 324 where each reference cell 124, 224, 324 extends past more than one of the plurality of data cells 122, 222, 322.

The terms "patterning" and "pattern" as used herein refer to the removal of material by any means, including but not limited to ion etching, reactive ion etching, or wet chemical etching. If the reference cells 124, 224, 324 rely on shape anisotropy to maintain a stable orientation of magnetization, the layer of material used to form reference cells 124, 224, 324 may be formed by depositing only a single layer of ferromagnetic material. If the reference cells 124, 224, 324 use antiferromagnetic coupling to maintain a stable orientation of magnetization, the reference cells 124, 224, 324 may be formed by depositing a first layer of magnetic material, depositing a layer of non-magnetic material over the first layer of magnetic material, and then depositing a second layer of magnetic material over the layer of non-magnetic material (for example, corresponding to ferromagnetic layer 224b, separation layer 228, and ferromagnetic layer 224a, respectively). As is known in the art, the ferromagnetic materials may be deposited in the presence of a magnetic field to help establish a preferred magnetic orientation.

In some instances, it may be desired that the data cells 122, 222, 322 be located at the bottom of the stack of materials, rather than at the top as described in the method above. In this situation, the memory devices 100, 200, 300, 400, 500 may be formed by depositing a layer of ferromagnetic material, and then patterning that layer to form a plurality of data cells 122, 222, 322. A separation layer 126, 226, 326 and layer of material used to form reference cells 124, 224, 324 may then be deposited over the patterned data cells 122, 222, 322. The layer of material used to form reference cells 124, 224, 324 may either be deposited in a patterned manner, or may be deposited and then patterned to form the elongated reference cells 124, 224, 324. As noted above, if the reference 124, 224, 324 rely on antiferromagnetic coupling to maintain a stable orientation of magnetization, the layers of materials used to form reference cells 124, 224, 324 may be formed by depositing a first layer of magnetic material, depositing a layer of non-magnetic material over the first layer of magnetic material, and then depositing a second layer of magnetic material over the layer of non-magnetic material (corresponding to ferromagnetic layer 224b, separation layer 228, and ferromagnetic layer 224a, respectively).

What is claimed is:

1. A memory device comprising:
    a plurality of magnetic data cells; and
    a magnetic reference cell extending uninterrupted along more than one of the plurality of data cells.

2. The memory device of claim 1, further comprising a separation layer disposed between the data cells and the reference cell.

3. The memory device of claim 1, wherein the reference cell has a length-to-width ratio of at least 4:1.

4. The memory device of claim 1, wherein the reference cell has an orientation of magnetization which lies parallel to its longest dimension.

5. The memory device of claim 1, wherein the reference cell has an orientation of magnetization which lies perpendicular to its longest dimension.

6. The memory device of claim 1, wherein each of the plurality of data cells have an alterable magnetic orientation and the reference cell has a pinned magnetic orientation.

7. The memory device of claim 1, wherein each of the plurality of data cells has an easy axis aligned with the magnetic orientation of the reference cell.

8. The memory device of claim 2, wherein the separation layer is non-conductive.

9. The memory device of claim 1, wherein the reference cell comprises at least two layers of ferromagnetic material, each pair of ferromagnetic layers separated by a layer of non-magnetic material.

10. The memory device of claim 9, wherein the two layers of ferromagnetic material are of unequal thickness.

11. The memory device of claim 9, wherein the non-magnetic material contains material selected from the group consisting of Cr, Cu, Ru, Re, and Os.

12. The memory device of claim 9, wherein the at least two layers of ferromagnetic material comprising the reference cell have an orientation of magnetization, and the orientations of magnetization are opposite to one another.

13. The memory device of claim 1, wherein the orientation of magnetization of the reference cell is pinned by shape anisotropy.

14. The memory device of claim 1, wherein the orientation of magnetization of the reference cell is pinned by magnetocrystalline anisotropy.

15. The memory device of claim 1, further comprising a layer of antiferromagnetic material adjacent the reference cell.

16. A non-volatile memory device comprising:
   a first layer having a magnetic cell with a fixed magnetic orientation;
   a second layer having a magnetic cell with an alterable magnetic orientation; and
   a separation layer disposed between the first and second layers;
   wherein the magnetic cell with a fixed magnetic orientation has a length-to-width ratio which is substantially greater than a length-to-width ratio of the magnetic cell with an alterable magnetic orientation.

17. The non-volatile memory device of claim 16, wherein the length-to-width ratio of the magnetic cell having a fixed magnetic orientation is at least 4:1.

18. The non-volatile memory device of claim 16, further comprising a plurality of a magnetic cells with an alterable magnetic orientation in the second layer.

19. The non-volatile memory device of claim 18, wherein the magnetic cell of the first layer extends uninterrupted along the plurality of magnetic cells in the second layer.

20. The non-volatile memory device of claim 16, wherein the separation layer is nonconductive.

21. The non-volatile memory device of claim 16, wherein the first layer comprises at least two layers of ferromagnetic material, and the two layers of ferromagnetic material are separated by a layer of non-magnetic material.

22. The non-volatile memory device of claim 21, wherein the layers of ferromagnetic material are of unequal thickness.

23. The non-volatile memory device of claim 16, wherein the orientation of magnetization of the first layer magnetic cell is fixed by shape anisotropy.

24. The non-volatile memory device of claim 16, wherein the orientation of magnetization of the first layer magnetic cell is fixed by magnetocrystalline anisotropy.

25. The non-volatile memory device of claim 16, further comprising a layer of antiferromagnetic material adjacent the first layer.

26. A memory device comprising:
   more than one magnetic data cells each data cell having an alterable magnetic field orientation; and
   means for providing a single fixed magnetic field orientation extending along each of the more than one magnetic data cells.

27. The device of claim 26, wherein the means for providing a single fixed magnetic field orientation utilizes shape anisotropy.

28. The device of claim 26, wherein the means for providing a single fixed magnetic field orientation utilizes magnetocrystalline anisotropy.

* * * * *